(12) United States Patent
Kröll et al.

(10) Patent No.: US 8,008,201 B2
(45) Date of Patent: Aug. 30, 2011

(54) AQUEOUS CERIUM OXIDE DISPERSION

(75) Inventors: Michael Kröll, Linsengericht (DE); Stefan Heberer, Gelnhausen-Meerholz (DE); Stipan Katusic, Bad Soden (DE); Michael Krämer, Schöneck (DE); Wolfgang Lortz, Wächtersbach (DE)

(73) Assignee: Evonik Degussa GmbH, Essen (DE)

( * ) Notice: Subject to any disclaimer, the term of this patent is extended or adjusted under 35 U.S.C. 154(b) by 389 days.

(21) Appl. No.: 11/910,668

(22) PCT Filed: Mar. 8, 2006

(86) PCT No.: PCT/EP2006/060560
§ 371 (c)(1),
(2), (4) Date: May 26, 2009

(87) PCT Pub. No.: WO2006/108743
PCT Pub. Date: Oct. 19, 2006

(65) Prior Publication Data
US 2010/0029080 A1    Feb. 4, 2010

(30) Foreign Application Priority Data
Apr. 14, 2005 (DE) .................. 10 2005 017 372

(51) Int. Cl.
*H01L 21/302* (2006.01)
*H01L 21/461* (2006.01)

(52) U.S. Cl. ........ 438/690; 438/691; 438/692; 438/693; 51/307; 51/308; 51/309

(58) Field of Classification Search .................. None
See application file for complete search history.

(56) References Cited

U.S. PATENT DOCUMENTS

| | | | |
|---|---|---|---|
| 5,036,015 A | 7/1991 | Sandhu et al. | |
| 6,069,081 A * | 5/2000 | Kelleher et al. | 438/692 |
| 6,783,434 B1 * | 8/2004 | Akahori et al. | 451/41 |
| 2001/0019895 A1 | 9/2001 | Robinson et al. | |
| 2005/0074610 A1 | 4/2005 | Kroll et al. | |

FOREIGN PATENT DOCUMENTS

| | | |
|---|---|---|
| EP | 1 043 379 A1 | 10/2000 |
| EP | A-1 043 379 | 10/2000 |
| EP | 1 130 630 A1 | 9/2001 |
| EP | A-1 130 630 | 9/2001 |
| EP | 1 179 578 A2 | 2/2002 |
| EP | A-1 179 578 | 2/2002 |
| EP | 1 219 568 A2 | 7/2002 |
| EP | A-1 219 568 | 7/2002 |
| EP | 1 234 801 A2 | 8/2002 |
| EP | A-1 234 801 | 8/2002 |
| EP | 1 274 123 A1 | 1/2003 |
| EP | A-1 274 123 | 1/2003 |
| EP | 1 493 789 A1 | 1/2005 |
| EP | A-1 493 789 | 1/2005 |
| JP | H08-134435 A | 5/1996 |
| WO | 2006/080796 A1 | 8/2006 |

OTHER PUBLICATIONS

Japanese Office Action in JP 2008-505852. Mailed Dec. 17, 2010. English translation provided.

* cited by examiner

*Primary Examiner* — Duy-Vu N Deo
(74) *Attorney, Agent, or Firm* — Smith, Gambrell & Russell, LLP

(57) ABSTRACT

Aqueous cerium oxide dispersion Aqueous cerium oxide dispersion, containing 5 to 60% by weight cerium oxide. It can be used to polish $SiO_2$ in the semiconductor industry.

5 Claims, 4 Drawing Sheets

AQUEOUS CERIUM OXIDE DISPERSION

INTRODUCTION AND BACKGROUND

The invention relates to a cerium oxide dispersion, to a process for producing it and to its use.

Cerium oxide dispersions are used in the semiconductor industry to polish $SiO_2$ (CMP). Cerium oxide dispersions are known from EP 1 596 940. These cerium oxide dispersions have particles with a mean aggregate diameter d50 of less than 200 nm.

The known cerium oxide dispersion disadvantageously includes at least one dispersant.

In addition, the known cerium oxide dispersion includes further additives which are used for STI CMP and are intended to shift the selectivity during the polishing of $SiO_2$ and $Si_3N_4$ in favour of the $SiO_2$.

The known cerium oxide dispersion also has the drawback that it has $SiO_2$ removal rates of <600 nm/min and is additionally unstable, since the cerium oxide forms a sediment (cf. DE 101 62 174 A1, U.S. Pat. No. 6,312,486).

The object therefore exists of producing a cerium oxide dispersion which does not have these drawbacks.

SUMMARY OF THE INVENTION

The subject matter of the application is an aqueous cerium oxide dispersion, containing 5 to 60% by weight cerium oxide, preferably 20 to 50% by weight cerium oxide, in particular 35 to 45% by weight cerium oxide.

This dispersion can be produced by means of wet jet mill or ultrasound equipment.

The cerium oxide dispersion according to the invention does not contain any dispersion additives or any additives for increasing the selectivity in STI CMP. It may have a pH of from 3 to 8. Since the dispersion according to the invention does not contain any dispersion additives, the stabilizing can only be effected by means of the pH.

It may have a low viscosity, in particular a viscosity of <30 mPas, preferably <20 mPas.

The particles of the dispersion according to the invention may have a particle size distribution, determined using Horiba LA 910, as follows:

d50<120 nm, preferably d50<100 nm, in particular d50<90 nm d99<200 nm, preferably d99<150 nm, in particular d99<130 nm.

The dispersion according to the invention has an excellent stability. The particle size distribution does not change with prolonged storage of the dispersion.

The cerium oxide dispersion according to the invention can be produced using known cerium oxide powders.

By way of example, it is possible to produce a cerium oxide powder as described in EP 1 506 940 A1.

Furthermore, it is possible to produce a cerium oxide powder in accordance with German Patent Application DE 10 2005 005 344.0. This application was filed with the German Patents and Trademark Office on 5 Feb. 2005.

Its wording is as follows, with regard to the cerium oxide powder:

It is an object of the invention to provide a process for producing metal oxide powders which allows a uniform powder with a high BET surface area and a narrow particle size distribution to be achieved and which is suitable for producing quantities in the kg/h range.

The subject matter of the invention is a process for producing a metal oxide powder with a BET surface area of at least 20 $m^2/g$ by reacting an aerosol with oxygen in a reaction space at a reaction temperature of more than 700° C., followed by separation of the powder obtained from the gaseous substances, wherein the aerosol is obtained by spraying at least one starting material, either itself in liquid form or in solution, and at least one atomization gas by means of a multi-fluid nozzle, the volume-based, mean drop diameter $D_{30}$ of the aerosol is 30 to 100 μm, and the number of aerosol drops which are larger than 100 μm is up to 10% based on the total number of drops.

Metal oxide powders in the sense of the invention also encompass mixed metal oxide powders and doped metal oxide powders.

BRIEF DESCRIPTION OF DRAWINGS

The present invention will be further understood with reference to the accompanying drawings, wherein.

DETAILED DESCRIPTION OF INVENTION

Figure 1:
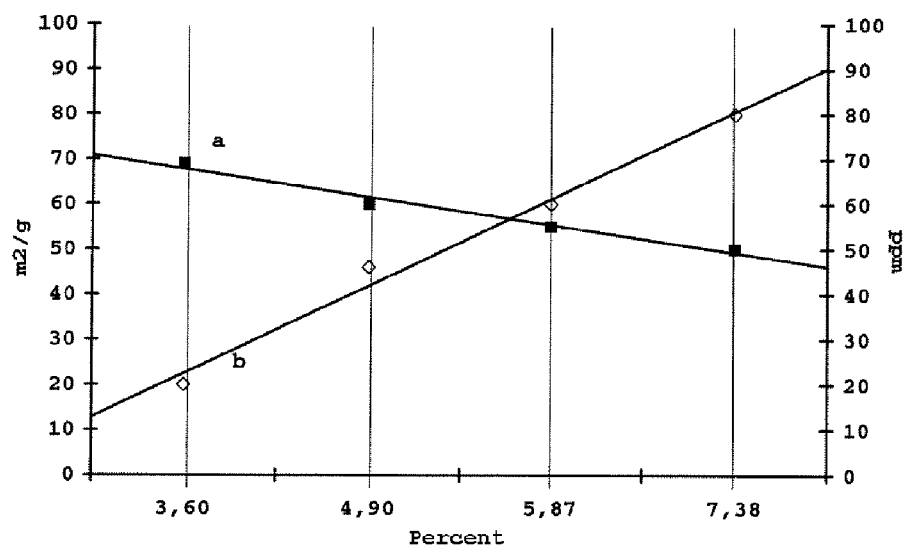
FIG. 1 is a graph of BET surface area in $m^2/g$ versus percentage of drops greater than 100 μm.

A mixed metal oxide powder is to be understood as meaning a powder involving intimate mixing of mixed oxide components at the level of primary particles or aggregates. In this case, the primary particles may have oxygen-bridged metal components in the form of $M_1$-O-$M_2$ bonds. In addition, it is also possible for regions of individual oxides $M_1O$, $M_2O$, $M_3O$, . . . to be present within the primary particles.

A doped metal oxide powder is to be understood as meaning a powder in which the doping component is located predominantly or exclusively at one lattice site in the metal oxide lattice. The doping component may be in metallic or oxidic form. An example of a doped metal oxide powder is indium tin oxide, where tin atoms occupy sites in the lattice of the indium oxide.

The volume-based, mean drop diameter $D_{30}$ is calculated as follows:

$$D_{30} = \sqrt[3]{\frac{1}{N}\sum_{i=1}^{N} D_i^3}$$

A starting material is to be understood as meaning a metal compound which is converted into a metal oxide under the reaction conditions. In the case of doped metal oxides, it may be possible for the starting material of the doping component to be converted into a metallic component.

In the context of the present process according to the invention, it had been discovered that it is possible to produce metal oxide powders with a high specific surface area by virtue of the volume-based, mean drop diameter $D_{30}$ being from 30 to 100 μm and at the same time up to 10% of the absolute number of drops being larger than 100 μm. It is in this way possible to increase the throughput of solution compared to the prior art without having to accept a significant reduction in the BET surface areas of the powders. The BET surface area of the powders obtained by the process according to the invention is at least 20 $m^2/g$, preferably 20 to 200 $m^2/g$.

The absolute drop size is determined using the principle of dual phase Doppler Anemometry using a 5W Argon Ion continuous wave laser.

In a preferred embodiment, the number of drops, based on the total number of drops, which are larger than 100 μm may be from 3% to 8%.

Furthermore, it may be advantageous if the percentage of drops which are larger than 250 μm is no more than 10%, based on the number of drops >100 μm.

In particular, it may be advantageous to use an embodiment in which the following dependent relationship between the volume-based, mean drop diameter $D_{30}$ and the spray width of the aerosol applies:

| Spray width [mm] | $D_{30}$ [μm] |
|---|---|
| 0 | 10 to 30 |
| ±20 | 20 to 40 |
| ±40 | 30 to 60 |
| ±60 | 50 to 80 |
| ±80 | 80 to 120. |

The throughput of a solution containing a starting material may preferably be from 1.5 to 2000 kg/h and particularly preferably from 100 to 500 kg/h.

In this case, the starting material content in the solution may be 2 to 60, preferably 5 to 40% by weight.

The metal component of the starting material may preferably be Al, Ce, Fe, Mg, In, Ti, Si, Sn, Y, Zn and/or Zr. In the context of the present invention, silicon dioxide is to be regarded as a metal oxide. Starting materials comprising Al, Ce or Zn may be preferred.

If starting materials with different metal components are used, mixed metal oxide powders are obtained. In this case, the proportion of one specific starting material and therefore the proportion of the corresponding metal oxide component in the mixed metal oxide powder is not subject to any particular restrictions.

The starting materials may be organometallic and/or inorganic in form, in which context organometallic compounds may be preferred. Examples of inorganic starting materials may in particular be metal chlorides and metal nitrates. Organometallic compounds used may in particular be metal alkoxides and/or metal carboxylates. Alkoxides used may preferably be ethoxides, n-propoxides, iso-propoxides, n-butoxides and/or tert-butoxides. The carboxylates used may be those of acetic acid, propionic acid, butanoic acid, hexanoic acid, oxalic acid, malonic acid, succinic acid, glutaric acid, adipic acid, octanoic acid, 2-ethylhexanoic acid, valeric acid, capric acid and/or lauric acid. 2-ethylhexanoates and/or laurates may particularly advantageously be used.

The inorganic starting compounds may preferably be in the form of a solution in water, and the organometallic starting compounds may be in the form of a solution in organic solvents.

Organic solvents or constituents of organic solvent mixtures used may preferably be alcohols, such as methanol, ethanol, n-propanol, iso-propanol, n-butanol or tert-butanol, diols, such as ethanediol, pentanediol, 2-methyl-2,4-pentanediol, dialkyl ethers, such as diethyl ether, tert-butyl-methyl ether or tetrahydrofuran, $C_1$-$C_{12}$-carboxylic acids, such as for example acetic acid, propionic acid, butanoic acid, hexanoic acid, oxalic acid, malonic acid, succinic acid, glutaric acid, adipic acid, octanoic acid, 2-ethylhexanoic acid, valeric acid, capric acid, lauric acid. It is also possible to use ethyl acetate, benzene, toluene, naphtha and/or benzene. Solutions which contain $C_2$-$C_{12}$-carboxylic acids, in particular 2-ethylhexanoic acid and/or lauric acid, may preferably be used.

It is preferable for the $C_2$-$C_{12}$-carboxylic acid content in the solution to be less than 60% by weight, particularly preferably less than 40% by weight, based on the total quantity of solution.

In a particularly preferred embodiment, the solutions of the starting materials simultaneously contain a carboxylate and the carboxylic acid on which it is based and/or an alkoxide and the alcohol on which it is based. The starting materials used may in particular be the 2-ethylhexanoates in a solvent mixture which contains 2-ethylhexanoic acid.

The atomization gas used in the process according to the invention may be a reactive gas, such as air, oxygen-enriched air and/or an inert gas such as nitrogen. The atomization gas used is generally air.

According to the process of the invention, the quantity of atomization gas is such that the ratio throughput of the solution of the starting material/quantity of atomization gas is preferably 2 to 25 $kg/m^3$ (s.t.p.), particularly preferably 5 to 10 $kg/m^3$ (s.t.p.).

Suitable multi-fluid nozzles for the process according to the invention are in particular three-fluid nozzles or four-fluid nozzles.

If three-fluid nozzles or four-fluid nozzles are used, it is possible for two or three, respectively, separate solutions, which contain

- identical or different starting materials,
- in identical or different solvents,
- in identical or different concentration, to be atomized in addition to the atomization gas.

By way of example, two solutions with different concentrations of a starting material and the same solvent or solvent mixture can be atomized simultaneously in this way. As a result, aerosol drops of different sizes are obtained.

Furthermore, by way of example, the atomization gas can be supplied via two nozzles or it is possible to use different atomization gases, for example air and steam.

Separate solutions of different starting materials can be used to produce mixed oxide powders.

The reaction temperature of more than 700° C. required in the process according to the invention can preferably be obtained by means of a flame generated by reaction of a hydrogen-containing fuel gas with (primary) air, if appropriate enriched with oxygen. Suitable fuel gases may be hydrogen, methane, ethane, propane, butane and/or natural gas, with hydrogen being particularly preferred. The reaction temperature is defined as the temperature which is established 0.5 m below the flame.

Furthermore, it may be advantageous if secondary air is additionally introduced into the reaction space. The quantity of secondary air will generally be set in such a way that the ratio of secondary air to primary air is from 0.1 to 10.

It is particularly advantageous if lambda is ≧1.5, with lambda being calculated from the quotient of the sum of the oxygen content of the air used (primary air, secondary air and atomization air) divided by the sum of the starting materials and of the hydrogen-containing fuel gas, in each case in mol/h. Very particularly preferably, the condition 2<lambda <5 may apply.

A cooling process generally precedes the separation of the powder out of the reaction mixture. This cooling process can be implemented directly, for example by means of a quench gas, or indirectly, for example by means of external cooling.

A further subject of the invention is a metal oxide powder obtainable by the process according to the invention. The metal oxide powder may contain impurities caused by the starting material and/or the process. The purity of the calcined metal oxide powder is at least 98% by weight, generally at least 99% by weight. A content of at least 99.8% by weight may be particularly preferred.

In general, the metal oxide powder is predominantly or exclusively in the form of aggregates of primary particles, in which case the aggregates do not have cenospheric structures. In the context of the invention, a cenospheric structure is to be understood as meaning a structure which has a size of from 0.1 to 20 μm and is approximately in the shape of a hollow sphere with a wall thickness of from 0.1 to 2 μm. The term predominantly is to be understood as meaning that a TEM image reveals individual unaggregated particles forming a proportion of no more than 10%.

The metal oxide powder may preferably have a BET surface area of from 30 to 200 $m^2/g$.

The coarse fraction >45 μm in the metal oxide powder according to the invention is preferably less than 100 ppm, particularly preferably less than 50 ppm.

The metal oxide powder according to the invention preferably has a carbon content of less than 0.15% by weight and a chloride, sodium and potassium content of less than 300 ppm.

The metal oxide powder according to the invention may preferably be a cerium oxide powder with a BET surface area of from 30 to 90 $m^2/g$.

The cerium oxide powder according to the invention, exposed to air and temperatures of 900° C. for a period of two hours, may have a BET surface area of up to 35 $m^2/g$.

The mean primary particle diameter of the cerium oxide powder may preferably be 5 to 20 nm, particularly preferably 8 to 14 nm.

The mean aggregate diameter of the cerium oxide powder may be 20 to 100 nm, particularly preferably 30 to 70 nm.

A further subject of the invention is the use of the metal oxide powder according to the invention for the production of dispersions, for the polishing of glass and metal surfaces, as a catalyst and as a catalyst support.

EXAMPLES

The specific surface area is determined in accordance with DIN 66131.

The TEM images are obtained using a Hitachi TEM appliance, type H-75000-2. The primary particle diameter and aggregate diameter of in each case approx. 2000 aggregates are evaluated by means of CCD-camera of the TEM appliance and subsequent image analysis. For this purpose, the powders are dispersed in isopropanol/water (1 min, ultrasonic processor UP 100H, Dr. Hielscher GmbH, 100 W).

The level of particles larger than 45 μm is determined based on DIN EN ISO 787, part 18.
Starting Materials Solution A: 42% by weight cerium(III) ethylhexanoate, 25% by weight 2-ethylhexanoic acid, 4% by weight 2-methyl-2,4-pentanediol, naphtha 29% by weight.
Solution B: 30% by weight cerium(III) acetate hydrate, 50% by weight acetic acid, 20% by weight lauric acid.
Solution C: 24.4 zirconium(III) ethylhexanoate, 0.30% by weight hafnium(III) ethylhexanoate, 39.6% by weight 2-ethylhexanoic acid, 3.5% by weight 2-(2-butoxyethoxy)ethanol, 32.2% by weight white spirit Example 1

An aerosol is generated from the part-streams I: 200 kg/h of solution A, II: 50 kg/h of solution A und III: 17.3 $m^3/h$ (s.t.p.) of atomization air by means of a three-fluid nozzle (Schlick, Model 0/4 S41), and this aerosol is atomized into a reaction space, where a hydrogen/oxygen flame comprising hydrogen (40 $m^3/h$ (s.t.p.)) and primary air (1800 $m^3/h$ (s.t.p.)), in which the aerosol is reacted, is burning. In addition, secondary air (3200 $m^3/h$ (s.t.p.)) is introduced into the reaction space.

After cooling, the cerium oxide powder is separated from gaseous substances at a filter. The residence time of the reaction mixture in the reaction space is 0.9 s. The temperature 0.5 m below the flame is 1100° C.

Examples 2 to 4 are carried out analogously to Example 1. Part-streams I and II remain identical, whereas the throughput and pressure of part-stream III are increased.

Example 5 is carried out analogously to Example 1, except that solution B is used instead of solution A for part-stream II.

Example 6 is carried out analogously to Example 1, except that solution C is used instead of solution A.

Example 7 is carried out analogously to Example 1, but with part-stream I consisting of solution A and part-stream II consisting of solution C.

Table 1 shows the parameters which are of significance to the aerosol generation, and Table 2 shows the parameters which are of significance for the flame.

Table 3 shows the analytical values of the powders obtained.

Table 4 shows the drop distribution in percent of all the drops >100 μm from Examples 1 to 4.

FIG. 1 shows the dependency of the BET surface area (a) in $m^2/g$ and of the particles >45 μm (b) on the percentage of drops >100 μm. FIG. 1 shows the relevance of the proportion of drops >100 μm to the BET surface area and the coarse fraction >45 μm. The process according to the invention allows the production of large quantities of metal oxide powder with a high BET surface area and a low coarse fraction, it being possible for the BET surface area and coarse fraction to be set by means of the proportion of drops >100 μm.

Figure 2:
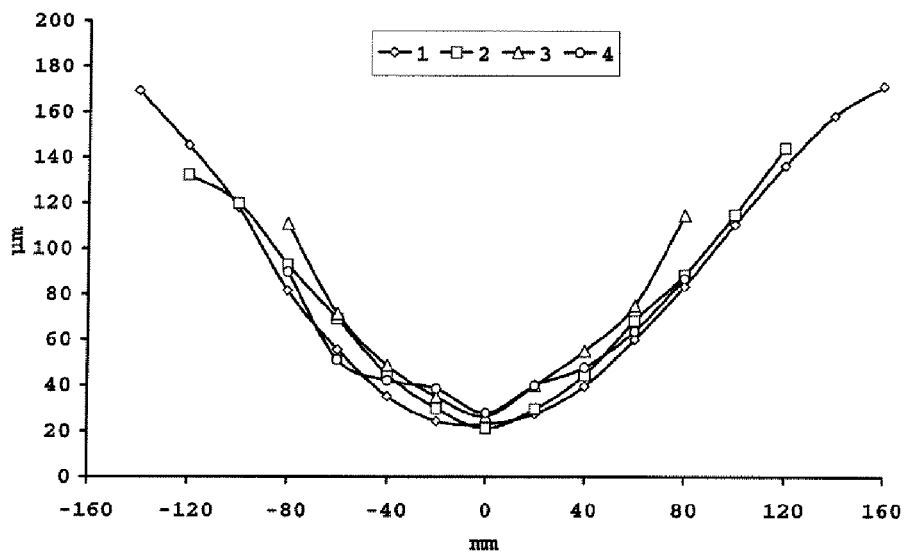
FIG. 2 is a graph showing the $D_{30}$ drop diameter in μm with respect to spray width.

FIG. 2 shows the $D_{30}$ drop diameter [μm] of the powders from Examples 1 to 4 in μm as a function of the spray width [mm]. $D_{30}$ values of up to 180 μm are obtained at the edges. Nevertheless, the process according to the invention allows the production of fine-particle metal oxide powders.

TABLE 1

| Aerosol generation | | | | | | | |
|---|---|---|---|---|---|---|---|
| | Example | | | | | | |
| | 1 | 2 | 3 | 4 | 5 | 6 | 7 |
| Part-stream I | | | | | | | |
| Solution | A | A | A | A | A | C | A |
| Flow rate [kg/h] | 50.0 | 50.0 | 50.0 | 50.0 | 50.0 | 50.0 | 70 |

TABLE 1-continued

Aerosol generation

| | Example | | | | | | |
|---|---|---|---|---|---|---|---|
| | 1 | 2 | 3 | 4 | 5 | 6 | 7 |
| Part-stream II | | | | | | | |
| Solution | A | A | A | A | B | C | C |
| Flow rate [kg/h] | 200.0 | 200.0 | 200.0 | 200. | 200.0 | 200.0 | 170 |
| Part-stream III | | | | | | | |
| Atomization air [m$^3$/h (s.t.p)] Pressure [bar superatmospheric] | 17.3 | 28.0 | 35.8 | 42.9 | 17.3 | 17.3 | 17.3 |
| Part-stream I | 0.4 | 0.4 | 0.4 | 0.4 | 0.4 | 0.4 | 0.4 |
| Part-stream II | 4.3 | 4.3 | 4.3 | 4.3 | 4.3 | 4.3 | 4.3 |
| Part-stream III | 0.5 | 1.0 | 1.5 | 2.0 | 0.5 | 0.5 | 0.5 |
| Drops | | | | | | | |
| Total number Diameter | 598864 | 539612 | 414543 | 381120 | 598812 | 598235 | 539009 |
| <100 μm | 92.62 | 94.13 | 95.10 | 98.94 | 92.81 | 92.15 | 91.60 |
| >100 μm | 7.38 | 5.87 | 4.90 | 3.60 | 7.29 | 7.85 | 8.40 |

TABLE 2

Flame parameter

| | Example | | | | | | |
|---|---|---|---|---|---|---|---|
| | 1 | 2 | 3 | 4 | 5 | 6 | 7 |
| Hydrogen [m$^3$/h (s.t.p.)] | 40 | 40 | 40 | 40 | 40 | 40 | 45 |
| Primary air [m$^3$/h (s.t.p.)] | 1800 | 1800 | 1800 | 1800 | 1800 | 1800 | 1800 |
| Secondary air [m$^3$/h (s.t.p.)] | 3200 | 3200 | 3200 | 3200 | 3200 | 3200 | 3300 |
| Atomization air [m$^3$/h (s.t.p.)] | 17.3 | 28.0 | 35.8 | 42.9 | 17.3 | 17.3 | 17.3 |
| lambda | 2.63 | 2.64 | 2.64 | 2.64 | 2.63 | 2.63 | 2.65 |
| Residence time [s] | 0.90 | 0.90 | 1.12 | 1.12 | 0.90 | 0.90 | 0.85 |
| Temperature[a] [° C.] | 1100 | 1020 | 1050 | 1050 | 1100 | 1100 | 1130 |

[a]Temperature = 0.5 m beneath the flame

TABLE 3

Analytical values for the powders obtained

| | Example | | | | | | |
|---|---|---|---|---|---|---|---|
| | 1 | 2 | 3 | 4 | 5 | 6 | 7 |
| BET surface area [m$^2$/g] | 50 | 55 | 60 | 69 | 42 | 45 | 70 |
| Fractions >45 μm [ppm] | 60 | 80 | 46 | 20 | 82 | 90 | 38 |
| C content [% by weight] | 0.08 | 0.08 | 0.09 | 0.09 | 0.11 | 0.13 | 0.07 |
| Cl-Content[a] [ppm] | 225 | 251 | 161 | 242 | 261 | 184 | 192 |
| Na-Content[a] [ppm] | 176 | 201 | 160 | 189 | 212 | 161 | 180 |
| K-Content[a] [ppm] | 112 | 156 | 145 | 126 | 154 | 128 | 167 |
| Mean primary particle diameter[b] [nm] | 9.3 | 11.3 | 9.0 | 8.5 | — | 13.0 | 9.6 |
| Mean aggregate diameter[b] [nm] | 47.5 | 48.5 | 47.3 | 47.0 | — | 66.0 | 47.1 |
| Mean aggregate surface area[b] [nm$^2$] | 2410 | 2738 | 2312 | 2280 | — | 5228 | 4288 |

[a]According to ICP-Measurement;
[b]Determined by means of image analysis;

TABLE 4

| | Drop distribution in % of all drops >100 μm | | | |
|---|---|---|---|---|
| Example | 1 | 2 | 3 | 4 |
| 100-150 μm | 7.14 | 11.17 | 18.00 | 25.39 |
| 151-200 μm | 42.09 | 48.67 | 56.42 | 37.23 |
| 201-250 μm | 45.64 | 33.25 | 23.33 | 33.34 |
| >250 μm | 5.13 | 6.91 | 2.25 | 4.04 |

A further subject of the invention is the use of the cerium oxide dispersion according to the invention for polishing glass, $SiO_2$ or $SiO_2$ on $Si_3N_4$ in the semiconductor industry.

During STI-CMP, the end point of the polishing of $SiO_2$ can be determined by means of the drop in the motor current when the nitride layer is reached.

A cerium oxide dispersion according to the invention can be used to polish $SiO_2$ surfaces with material removal rates of >600 nm/min, preferably up to 1200 nm/min, in particular 1000 nm/min at a small pV value of 60000 N/ms. For this purpose, a slurry is produced containing 0.1 to 10% cerium oxide, preferably 0.2 to 5% and particularly preferably 0.5-1.5% cerium oxide. This dispersion can be obtained by dilution. Polishing is carried out at pHs of <8, preferably 5-8, particularly preferably 7-8.

Moreover, it was surprisingly established that the motor currents measured during the polishing of $SiO_2$ and $Si_3N_4$ differ from one another if the cerium oxide dispersion according to the invention is used. This is unusual and can be exploited in what is known as STI (Shallow Trench Isolation). Here, a structure comprising $SiO_2$ and $Si_3N_4$ is produced on the wafer.

The objective is to polish $SiO_2$ as selectively as possible and to stop the polishing operation when the nitride is reached. For this purpose, additives are added to the slurry so as to increase this selectivity by protecting the nitride (protection against over-polishing) The end point determination is carried out by the determination of $NH_3$.

Surprisingly, these additives are not required with the dispersion according to the invention.

Since the motor currents measured during polishing vary considerably, the drop in the motor current can be used for the end point determination (if the motor current drops, the polishing of the oxide is complete and the nitride has been reached→ intrinsic protection against over-polishing even without additives).

Figure 3:
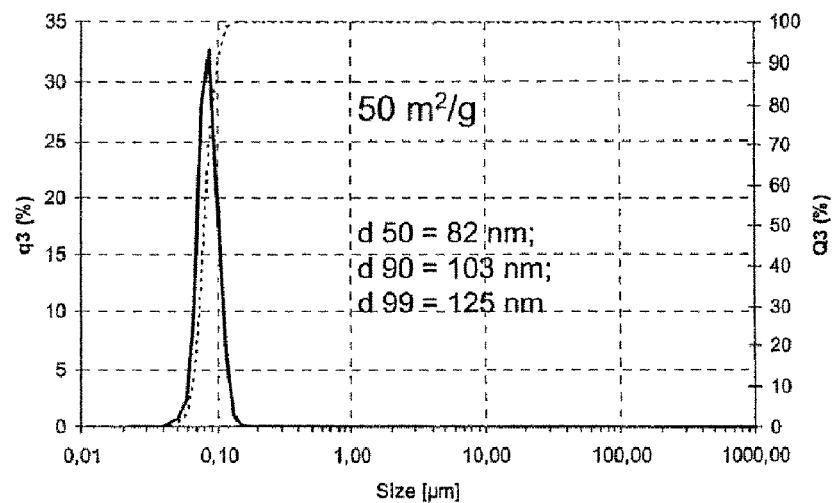
FIG. 3 is a graph of particle size distribution.

FIG. 3 shows the particle size distribution (Horiba LA 910) of a 5% strength dispersion in water at a pH of 3.9 and without additives.

Figure 4:
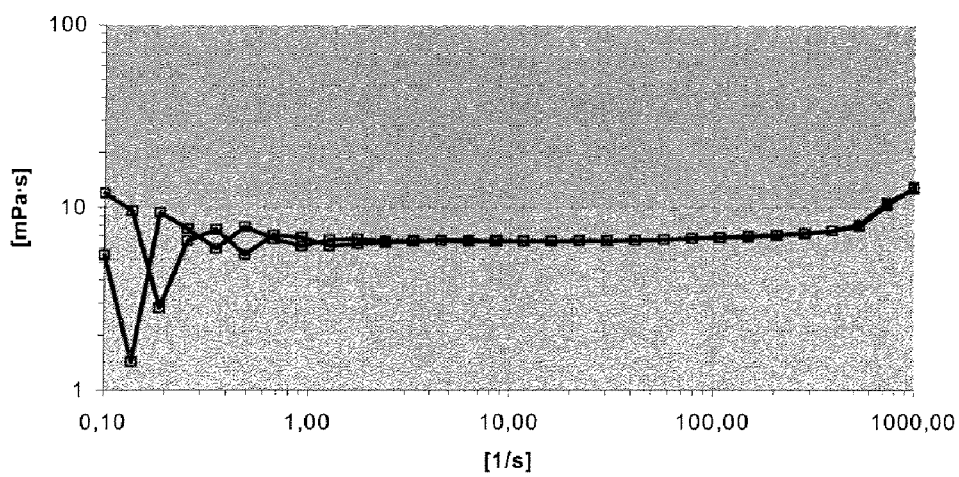
FIG. 4 is a graph of viscosity.

FIG. 4 shows the viscosity of a 40% strength dispersion in water.

Figure 5:
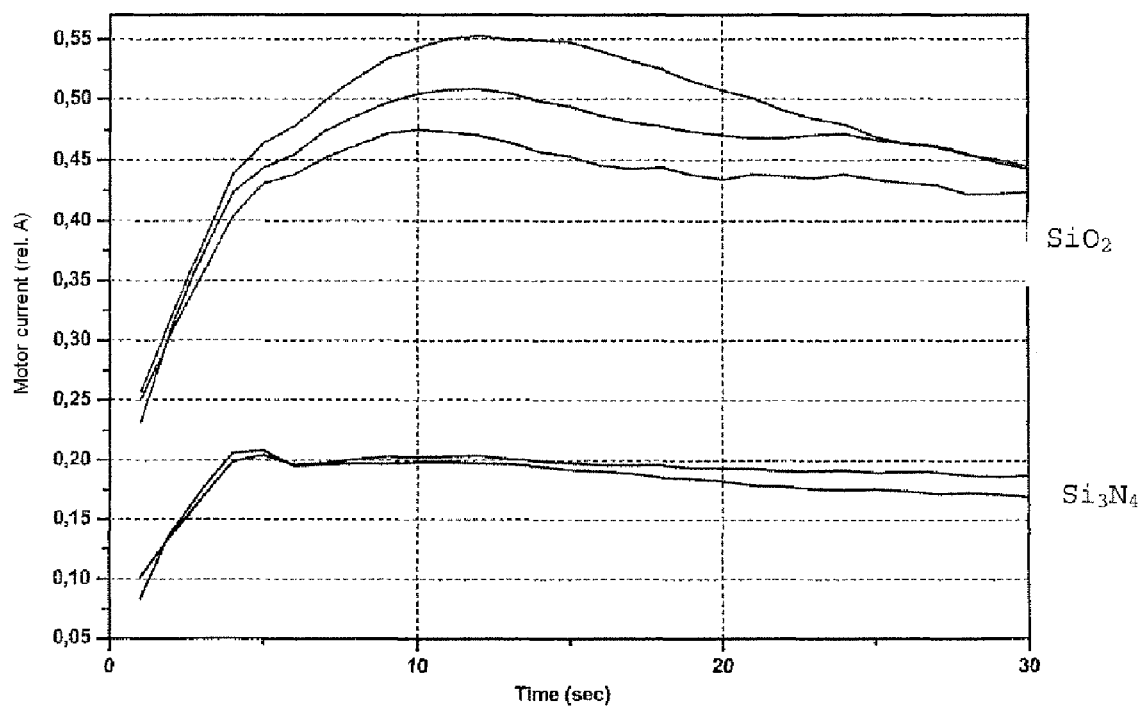
FIG. 5 is a graph of motor currents by time.

FIG. 5 shows the motor currents measured for $SiO_2$ polishing and $Si_3N_4$ polishing using a 0.5% strength cerium oxide dispersion with a surface area of 50 $m^2/g$ in water, at a pH of 7.6.

Figure 6:
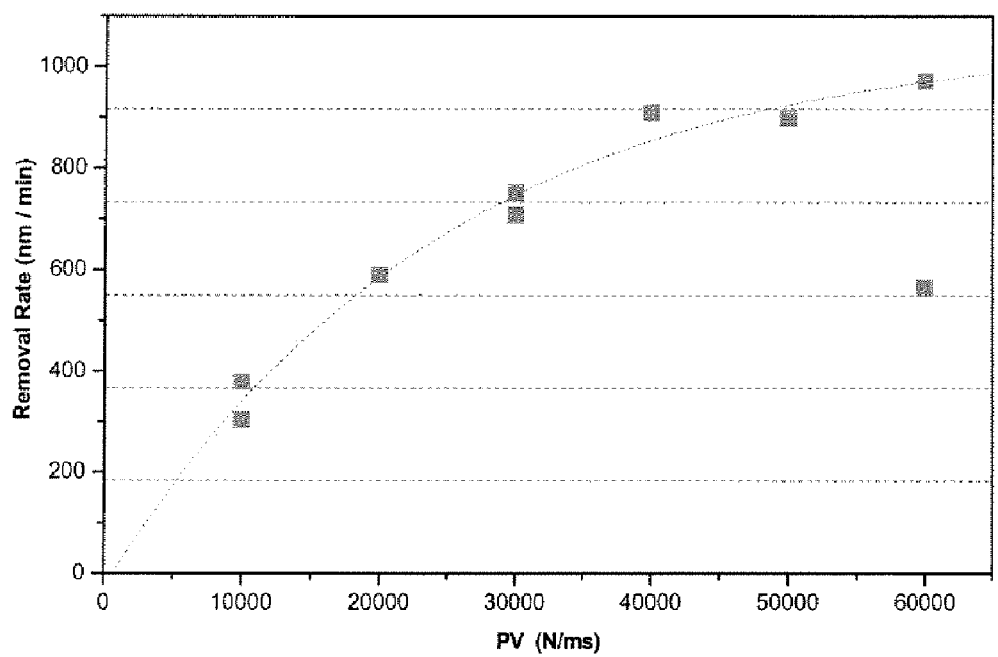
FIG. 6 is a graph of removal rates of $SiO_2$ polishing tests.

FIG. 6 shows $SiO_2$ polishing tests using a 0.5% strength cerium oxide dispersion, at a pH of 7.6, the cerium oxide having a BET surface area of 50 $m^2/g$.

The invention claimed is:

1. An aqueous cerium oxide dispersion, consisting of 5 to 60% by weight cerium oxide, including aggregate particles with a particle size distribution of
   d50<120 nm
   d99<200 nm
in water, which has a pH of 3 to 8 and a viscosity of less than 30 mPas.

2. A process for polishing comprising polishing $SiO_2$ or $Si_3N_4$ with the cerium oxide dispersion according to claim 1.

3. The process for polishing $SiO_2$ or $Si_3N_4$ according to claim 2, which comprises polishing until reaching an end point which is determined by a drop in motor current.

4. A process for producing the cerium oxide dispersion according to claim 1, comprising dispersing cerium oxide powder in water.

5. The aqueous cerium oxide dispersion of claim 1, wherein the dispersion does not contain any dispersants or additives which increase the selectivity of $SiO_2$ over $Si_3N_4$ in Shallow Trench Isolation (STI) Chemical-Mechanical Planarizing (CMP) processing.

* * * * *